US009881576B2

(12) United States Patent
Huang

(10) Patent No.: US 9,881,576 B2
(45) Date of Patent: Jan. 30, 2018

(54) SHIFT REGISTER, GATE DRIVING CIRCUIT, AND DISPLAY PANEL

(71) Applicants: Boe Technology Group Co., Ltd., Beijing (CN); Ordos Yuansheng Optoelectronics Co., Ltd., Inner Mongolia (CN)

(72) Inventor: Fei Huang, Beijing (CN)

(73) Assignees: BOE TECHNOLOGY GROUP CO., LTD., Beijing (CN); ORDOS YUANSHENG OPTOELECTRONICS CO., LTD., Inner Mongolia (CN)

( * ) Notice: Subject to any disclaimer, the term of this patent is extended or adjusted under 35 U.S.C. 154(b) by 0 days.

(21) Appl. No.: 14/907,029

(22) PCT Filed: Jul. 17, 2015

(86) PCT No.: PCT/CN2015/084277
§ 371 (c)(1),
(2) Date: Jan. 22, 2016

(87) PCT Pub. No.: WO2016/150037
PCT Pub. Date: Sep. 29, 2016

(65) Prior Publication Data
US 2017/0039971 A1 Feb. 9, 2017

(30) Foreign Application Priority Data
Mar. 26, 2015 (CN) .......................... 2015 1 0138217

(51) Int. Cl.
G11C 19/00 (2006.01)
G09G 3/36 (2006.01)
(Continued)

(52) U.S. Cl.
CPC ............. *G09G 3/3677* (2013.01); *G09G 3/36* (2013.01); *G11C 19/184* (2013.01); *G11C 19/28* (2013.01);
(Continued)

(58) Field of Classification Search
None
See application file for complete search history.

(56) References Cited

U.S. PATENT DOCUMENTS

2004/0140839 A1* 7/2004 Nagao .................... G11C 19/28
327/291
2006/0220587 A1* 10/2006 Tobita .................... G11C 19/28
315/194
(Continued)

FOREIGN PATENT DOCUMENTS

CN 103295511 9/2013
CN 103700356 4/2014
(Continued)

OTHER PUBLICATIONS

Office action from Chinese Application No. 201510138217.3 dated Apr. 27, 2016.
(Continued)

Primary Examiner — Tuan T Lam
(74) Attorney, Agent, or Firm — Calfee, Halter & Griswold LLP

(57) ABSTRACT

The present disclosure provides a shift register, a gate driving circuit and a display panel and a display device. The shift register comprises an input module, a reset module, a pull-up module, a first pull-down module, a second pull-down module, an output control module, and an output denoising module. The output denoising module feeds the scanning signal back to the first control terminal of the output control module when the scanning signal output
(Continued)

terminal outputs the scanning signal, thereby reducing noise of the signal of the first control terminal of the output control module and further reducing noise of the scanning signal outputted by the scanning signal output terminal.

19 Claims, 8 Drawing Sheets

(51) Int. Cl.
    *G11C 19/28*     (2006.01)
    *G11C 19/18*     (2006.01)

(52) U.S. Cl.
    CPC . *G09G 2310/0286* (2013.01); *G09G 2310/08* (2013.01); *G09G 2320/0209* (2013.01); *G09G 2330/021* (2013.01)

(56) References Cited

U.S. PATENT DOCUMENTS

| | | |
|---|---|---|
| 2007/0188436 A1 | 8/2007 | Wei et al. |
| 2010/0289780 A1 | 11/2010 | Chang et al. |
| 2011/0274236 A1* | 11/2011 | Tobita .................... G11C 19/28 377/79 |
| 2014/0056399 A1* | 2/2014 | Shang .................... G11C 19/28 377/68 |
| 2014/0354655 A1* | 12/2014 | Kim .......................... G06T 1/20 345/501 |
| 2015/0015558 A1* | 1/2015 | Sasaki .................. G09G 3/3677 345/211 |
| 2015/0179277 A1* | 6/2015 | Pai ............................ G09G 3/20 377/68 |
| 2016/0225462 A1* | 8/2016 | Harada .................. G11C 19/28 |

FOREIGN PATENT DOCUMENTS

| | | |
|---|---|---|
| CN | 103927972 | 7/2014 |
| CN | 104299594 | 1/2015 |
| CN | 104700805 | 6/2015 |

OTHER PUBLICATIONS

International Search Report and Written Opinion from PCT/CN15/84277 dated Dec. 10, 2015.

* cited by examiner

US 9,881,576 B2

SHIFT REGISTER, GATE DRIVING CIRCUIT, AND DISPLAY PANEL

RELATED APPLICATIONS

The present application is the U.S. national phase entry of PCT/CN2015/084277, with an international filing date of Jul. 17, 2015, which claims the benefit of Chinese Patent Application No. 201510138217.3, filed on Mar. 26, 2015, the entire disclosures of which are incorporated herein by reference.

FIELD

The present disclosure relates to the display technical field, particularly to a shift register, gate driving circuit and display panel.

BACKGROUND

At present, with the development of liquid crystal display techniques, the competition in the liquid crystal panel industry becomes fiercer and fiercer, and a preferred scheme of the panel vendors is to reduce the production cost of the liquid crystal display panel in order to enhance competitiveness. In order to reduce the production cost of the display panel, disposing the gate driving circuit at edge of the display panel is known by the skilled person in the art. The gate driving circuit comprises multiple shift registers and each of the shift register corresponds to one gate line. The multiple shift registers are arranged in series, and there is a trigger signal transferred stage by stage between two adjacent shift registers. Each shift register, after receiving a trigger signal, outputs a gate line scanning signal to a corresponding gate line, and transfers the trigger signal to a next-stage unit circuit to carry out the gate driving function. Such design can omit the need to individually set a gate driving chip in the frame region of the display panel, thus it facilitates achieving narrow-frame design of the display panel, simultaneously reduces the product cost of a relevant product, and enhances market competitiveness of the display product.

Generally, the circuit structure of an existing shift register is shown in FIG. 1, and its corresponding input and output time sequential diagram is shown in FIG. 2. As can be seen from FIG. 2, when the shift register normally is turned on to operate, the electric potential of a first node PU of the shift register is pulled up during a first time period and continues to be pulled up during a second time period, thereby controlling a switch transistor T7 to switch on, such that a scanning signal output terminal correspondingly outputs a scanning signal. However, since the voltage signal outputted by the first node PU has noise (as shown in Region A marked in FIG. 2), and the electric potential of the signal generated by the first node PU when it is pulled up for the first time is relatively high, the charging and discharging process of a capacitor C1 easily causes the scanning signal outputted by the scanning signal output terminal to have great noise (as shown in Region B marked in FIG. 2), further resulting in large power consumption of the shift register circuit and decreasing the yield of the display panel.

Therefore, those skilled in the art desiderate to solve the technical problem of how to reduce noise of the scanning signal outputted by the shift register to reduce power consumption, thereby increasing the yield of the display panel.

SUMMARY

It is an object of the present disclosure to provide a shift register, a gate driving circuit and a display panel, which can at least in part alleviate or eliminate the aforesaid problem.

A first aspect of the present disclosure provides a shift register comprising an input module, a reset module, a pull-up module, a first pull-down module, a second pull-down module, an output control module, and an output denoising module; wherein, an input terminal of said input module is connected to a first reference signal terminal, a control terminal of said input module is connected to a signal input terminal, an output terminal of said input module is connected to a first node, said input module is used for pulling up electric potential of said first node under the control of said signal input terminal;

an input terminal of said reset module is connected to a second reference signal terminal, a control terminal of said reset module is connected to a reset signal terminal, an output terminal of said reset module is connected to said first node, said reset module is used for pulling down electric potential of said first node under the control of said reset signal terminal;

an input terminal and a control terminal of said pull-up module are connected to a first clock signal terminal, respectively, an output terminal of said pull-up module is connected to a second node, said pull-up module is used for pulling up electric potential of said second node under the control of said first clock signal terminal;

an input terminal of said first pull-down module is connected to a low level signal terminal, a control terminal of said first pull-down module is connected to said second node, an output terminal of said first pull-down module is connected to said first node, said first pull-down module is used for pulling down electric potential of said first node under the control of said second node;

an input terminal of said second pull-down module is connected to a low level signal terminal, a control terminal of said second pull-down module is connected to said first node, an output terminal of said second pull-down module is connected to said second node, said second pull-down module is used for pulling down electric potential of said second node under the control of said first node;

a first input terminal of said output control module is connected to said low level signal terminal, a second input terminal of said output control module is connected to a second clock signal terminal, a first control terminal of said output control module is connected to said first node, a second control terminal of said output control module is connected to said second node, an output terminal of said output control module is connected to said scanning signal output terminal, said output control module is used for controlling said scanning signal output terminal to choose to output a signal of said second clock signal terminal or a signal of said low level signal terminal under the control of said first node and said second node;

an input terminal of said output denoising module is connected to a high level signal terminal, a control terminal of said output denoising module is connected to said scanning signal output terminal, an output terminal of said output denoising module is connected to said first node, said output denoising module is used for feeding a scanning signal back to the first control terminal of said output control module when said scanning signal output terminal outputs said scanning signal.

According to an embodiment, said output denoising module may comprise a first switch transistor. A gate of said first switch transistor is connected to said scanning signal output terminal, a source of said first switch transistor is connected to said high level signal terminal, and a drain of said first switch transistor is connected to said first node.

According to another embodiment, said output denoising module may further comprise a transmission module. Said transmission module is connected between said high level signal terminal, the output terminal of said input module, the output terminal of said reset module, the output terminal of said first pull-down module, the drain of said first switch transistor, and said first node. Said transmission module is used for filtering and denoising a signal of the drain of said first switch transistor and then outputting it to said first node.

According to a further embodiment, said transmission module may comprise a second switch transistor. A gate of said second switch transistor is connected to said high level signal terminal, a source of said second switch transistor is connected to the drain of said first switch transistor, and a drain of said second switch transistor is connected to said first node.

According to yet another embodiment, said output control module may comprise a first output control module and a second output control module; wherein, said first output control module is connected between said first node, said second clock signal terminal, and said scanning signal output terminal, said first output control module is used for controlling said scanning signal output terminal to output a signal of said second clock signal terminal under the control of said first node;

said second output control module is connected between said low level signal terminal, said second node, and said scanning signal output terminal, said second output control module is used for controlling said scanning signal output terminal to output a signal of said low level signal terminal under the control of said second node.

In an embodiment, said first output control module may comprise a third switch transistor and a first capacitor; wherein, a gate of said third switch transistor is connected to said first node, a source of said third switch transistor is connected to said second clock signal terminal, a drain of said third switch transistor is connected to said scanning signal output terminal;

said first capacitor is connected between said first node and said scanning signal output terminal.

According to another embodiment, said second output control module may comprise a fourth switch transistor and a fifth switch transistor; wherein, a gate of said fourth switch transistor is connected to said second node, a source of said fourth switch transistor is connected to said low level signal terminal, a drain of said fourth switch transistor is connected to said scanning signal output terminal;

a gate of said fifth switch transistor is connected to said second node, a source of said fifth switch transistor and a drain of said fifth switch transistor are connected to said low level signal terminal, respectively.

According to a further embodiment, said second output control module may comprise a fourth switch transistor and a second capacitor; wherein, a gate of said fourth switch transistor is connected to said second node, a source of said fourth switch transistor is connected to said low level signal terminal, a drain of said fourth switch transistor is connected to said scanning signal output terminal;

said second capacitor is connected between said second node and said low level signal terminal.

According to yet another embodiment, said input module may comprise a sixth switch transistor. A gate of said sixth switch transistor is connected to said signal input terminal, a source of said sixth switch transistor is connected to said first reference signal terminal, and a drain of said sixth switch transistor is connected to the drain of said first switch transistor and the source of said second switch transistor, respectively.

According to an embodiment, said reset module may comprise a seventh switch transistor. A gate of said seventh switch transistor is connected to said reset signal terminal, a source of said seventh switch transistor is connected to said second reference signal terminal, and a drain of said seventh switch transistor is connected to the drain of said first switch transistor and the source of said second switch transistor.

According to another embodiment, said first pull-down module may comprise an eighth switch transistor. A gate of said eighth switch transistor is connected to said second node, a source of said eighth switch transistor is connected to said low level signal terminal, and a drain of said eighth switch transistor is connected with the drain of said first switch transistor and the source of said second switch transistor, respectively.

According to a further embodiment, said pull-up module may comprise a ninth switch transistor. A gate and a source of said ninth switch transistor are connected to said first clock signal terminal, respectively, and a drain of said ninth switch transistor is connected to said second node.

According to yet another embodiment, said second pull-down module may comprise a tenth switch transistor. A gate of said tenth switch transistor is connected to said first node, a source of said tenth switch transistor is connected to said low level signal terminal, and a drain of said tenth switch transistor is connected to said second node.

A second aspect of the present disclosure provides a gate driving circuit, comprising multiple cascaded shift registers as provided by the first aspect of the present disclosure, wherein the scanning signal output terminal of each of the shift registers except the first shift register and the last shift register inputs a trigger signal to the signal input terminal of its next adjacent shift register, and inputs a reset signal to the reset signal terminal of its previous adjacent shift register; the scanning signal output terminal of the first shift register inputs a trigger signal to the signal input terminal of the second shift register; the scanning signal output terminal of the last shift register inputs a reset signal to itself and the reset signal terminal of the previous shift register.

A third aspect of the present disclosure provides a display panel, comprising a gate driving circuit as provided by the second aspect of the present disclosure.

A fourth aspect of the present disclosure provides a display device, comprising a display panel as provided by the third aspect of the present disclosure.

The embodiments of the present disclosure provide a shift register, a gate driving circuit, a display panel and a display device, wherein the shift register comprises an input module, a reset module, a pull-up module, a first pull-down module, a second pull-down module, an output control module, and an output denoising module; wherein, the input module is used for pulling up electric potential of the first node under the control of the signal input terminal; the reset module is used for pulling down electric potential of the first node under the control of the reset signal terminal; the pull-up module is used for pulling up electric potential of the second node under the control of the first clock signal terminal; the first pull-down module is used for pulling down electric potential of the first node under the control of the second node; the second pull-down module is used for pulling down electric potential of the second node under the control of the first node; the output control module is used for controlling the scanning signal output terminal to choose to output a signal of the second clock signal terminal or a signal of the low level signal terminal under the control of the first node and the second node. The function of the shift register of outputting a scanning signal is achieved by virtue of such arrangement. Meanwhile, the output denoising module feeds the scanning signal back to the first control terminal of the output control module when the scanning signal output terminal outputs the scanning signal, thereby reducing noise of the signal of the first control terminal of the output control module and further reducing noise of the scanning signal outputted by the scanning signal output terminal. In this way lossless transmission of signal is enhanced, which reduces power consumption and thereby increases the yield of the display panel.

DETAILED DESCRIPTION

Specific implementations of the shift register, gate driving circuit, display panel and display device as provided by the embodiments of the present disclosure are explained in detail as follows in combination with the Figures.

Figure 1:
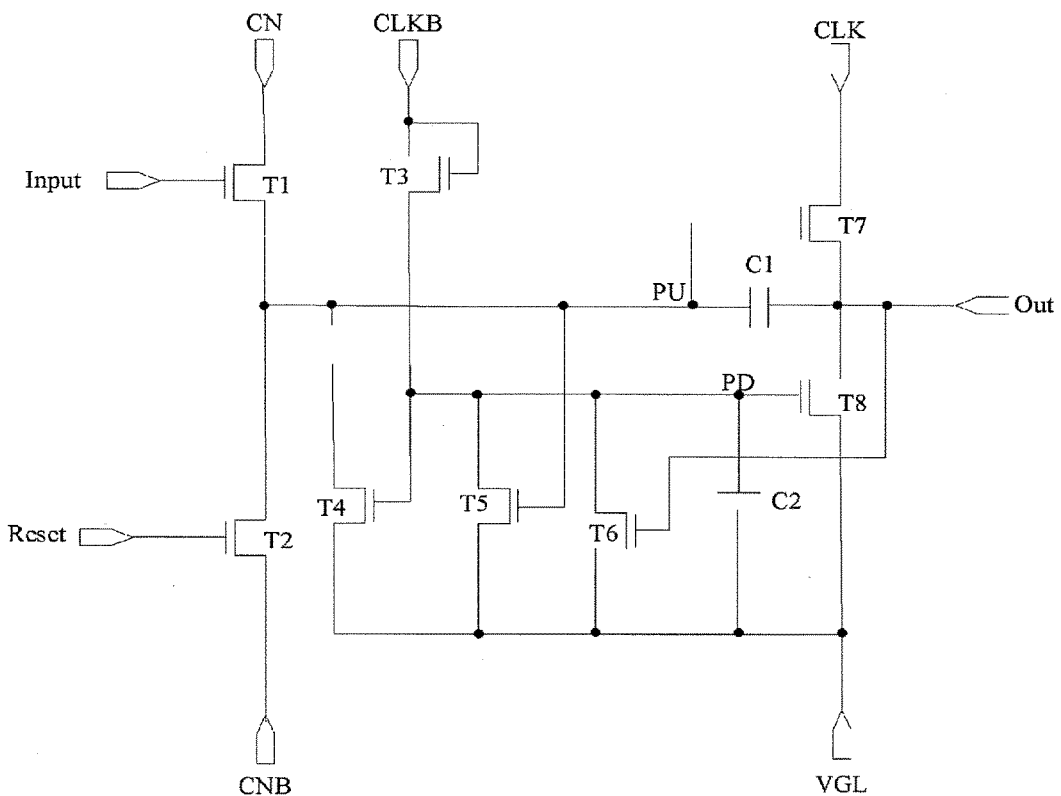
FIG. 1 is a schematic diagram of the structure of a shift register in the prior art.
Figure 2:
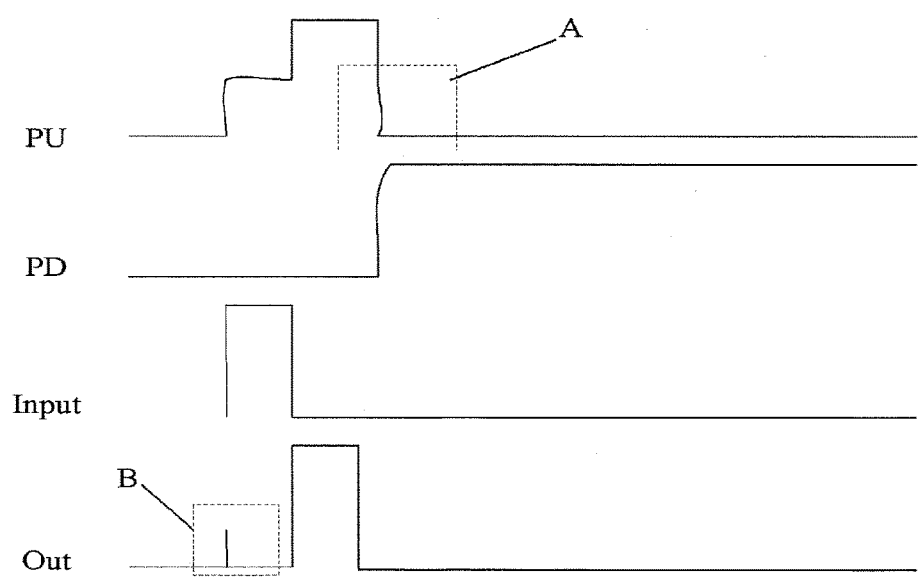
FIG. 2 is an input and output time sequential diagram of a shift register in the prior art.
Figure 3:
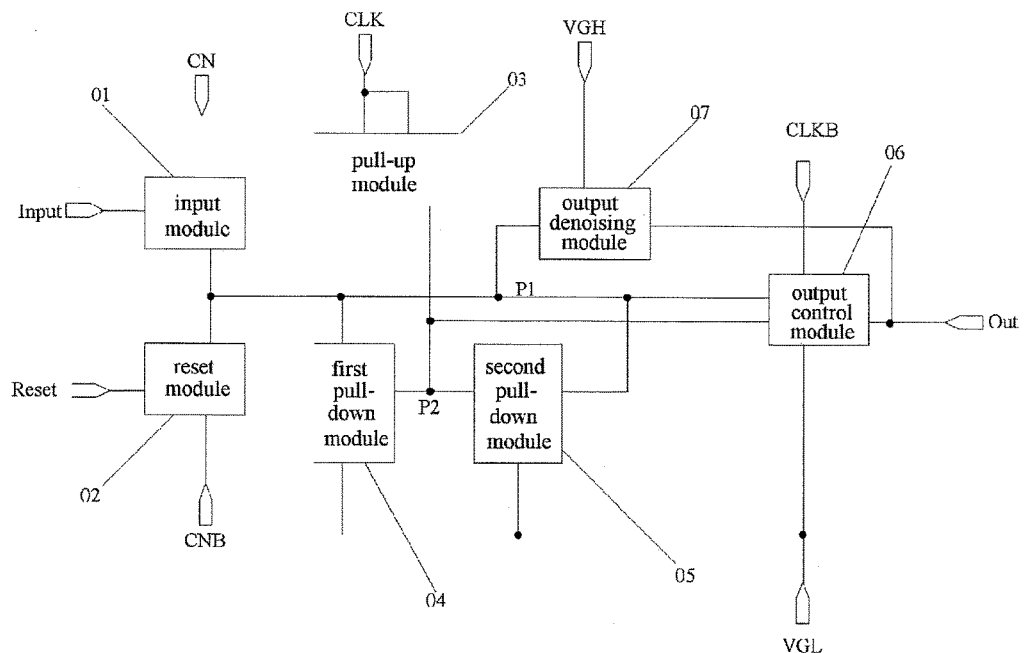
FIG. 3 is a schematic diagram of the structure of a shift register provided by the embodiments of the present disclosure.

As shown in FIG. 3, a shift register comprises: an input module 01, a reset module 02, a pull-up module 03, a first pull-down module 04, a second pull-down module 05, an output control module 06, and an output denoising module 07; wherein, an input terminal of the input module 01 is connected to a first reference signal terminal CN, a control terminal is connected to a signal input terminal Input, an output terminal is connected to a first node P1, the input module 01 is used for pulling up electric potential of the first node P1 under the control of the signal input terminal Input;

an input terminal of the reset module 02 is connected to a second reference signal terminal CNB, a control terminal is connected to a reset signal terminal Reset, an output terminal is connected to the first node P1, the reset module 02 is used for pulling down electric potential of the first node P1 under the control of the reset signal terminal Reset;

an input terminal and a control terminal of the pull-up module 03 are connected to a first clock signal terminal CLK, respectively, an output terminal is connected to a second node P2, the pull-up module 03 is used for pulling up electric potential of the second node P2 under the control of the first clock signal terminal CLK;

an input terminal of the first pull-down module 04 is connected to a low level signal terminal VGL, a control terminal is connected to the second node P2, an output terminal is connected to the first node P1, the first pull-down module 04 is used for pulling down electric potential of the first node P1 under the control of the second node P2;

an input terminal of the second pull-down module 05 is connected to a low level signal terminal VGL, a control terminal is connected to the first node P1, an output terminal is connected to the second node P2, the second pull-down module 05 is used for pulling down electric potential of the second node P2 under the control of the first node P1;

a first input terminal of the output control module 06 is connected to the low level signal terminal VGL, a second input terminal is connected to a second clock signal terminal CLKB, a first control terminal is connected to the first node P1, a second control terminal is connected to the second node P2, an output terminal is connected to the scanning signal output terminal Out, the output control module 06 is used for controlling the scanning signal output terminal Out to choose to output a signal of the second clock signal terminal CLKB or a signal of the low level signal terminal VGL under the control of the first node P1 and the second node P2;

an input terminal of the output denoising module 07 is connected to a high level signal terminal VGH, a control terminal is connected to the scanning signal output terminal Out, an output terminal is connected to the first node P1, the output denoising module 07 is used for feeding a scanning signal back to the first control terminal of the output control module 06 when the scanning signal output terminal Out outputs the scanning signal.

The above shift register comprises an input module 01, a reset module 02, a pull-up module 03, a first pull-down module 04, a second pull-down module 05, an output control module 06, and an output denoising module 07; wherein, the input module 01 is used for pulling up electric potential of the first node P1; the reset module 02 is used for pulling down electric potential of the first node P1; the pull-up module 03 is used for pulling up electric potential of the second node P2; the first pull-down module is used for pulling down electric potential of the first node P1; the second pull-down module is used for pulling down electric potential of the second node P2; the output control module 06 is used for controlling the scanning signal output terminal Out to choose to output a signal of the second clock signal terminal CLKB or a signal of the low level signal terminal VGL. The function of the shift register of outputting a scanning signal is achieved by virtue of such arrangement. Meanwhile, the output denoising module 07 feeds the scanning signal back to the first control terminal of the output control module 06 when the scanning signal output terminal Out outputs the scanning signal, thereby reducing noise of the signal of the first control terminal of the output control module 06 and further reducing noise of the scanning signal outputted by the scanning signal output terminal Out. In this way lossless transmission of signal is enhanced, which reduces power consumption and thereby increases the yield of the display panel.

Figure 4:
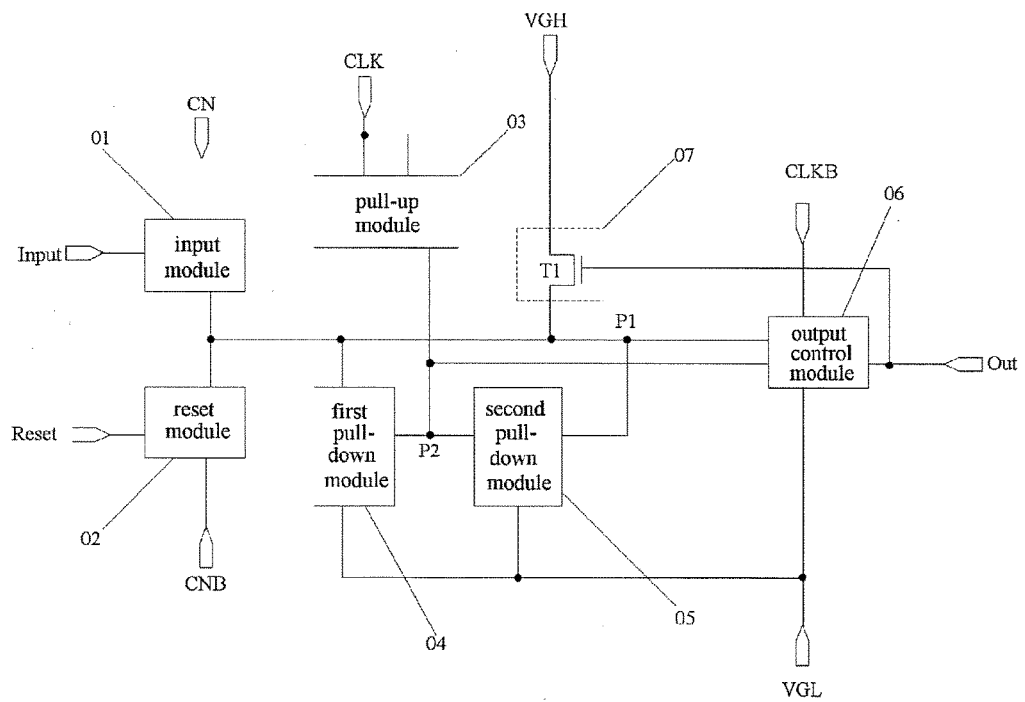
FIG. 4 is an illustrative schematic diagram of the structure of an output denoising module in a shift register provided by the embodiments of the present disclosure.

Upon implementation, in the above shift register, as shown in FIG. 4, the output denoising module 07 comprises a first switch transistor T1. A gate of the first switch transistor T1 is connected to the scanning signal output terminal Out, a source is connected to the high level signal terminal VGH, and a drain is connected to the first node P1.

Specifically, when the scanning signal output terminal Out outputs a scanning signal, the first switch transistor T1 is in conducting state. The conducting first switch transistor T1 conducts the high level signal terminal VGH with the first node P1 to pull up electric potential of the first node P1. Namely, when the scanning signal output terminal Out outputs a scanning signal, the scanning signal is fed back to the first control terminal of the output control module 06, thereby reducing noise of the signal of the first control terminal of the output control module 06 and further reducing noise of the scanning signal outputted by the scanning signal output terminal Out. Such arrangement enhances lossless transmission of signal, reduces power consumption and thereby increases the yield of the display panel.

Figure 5:
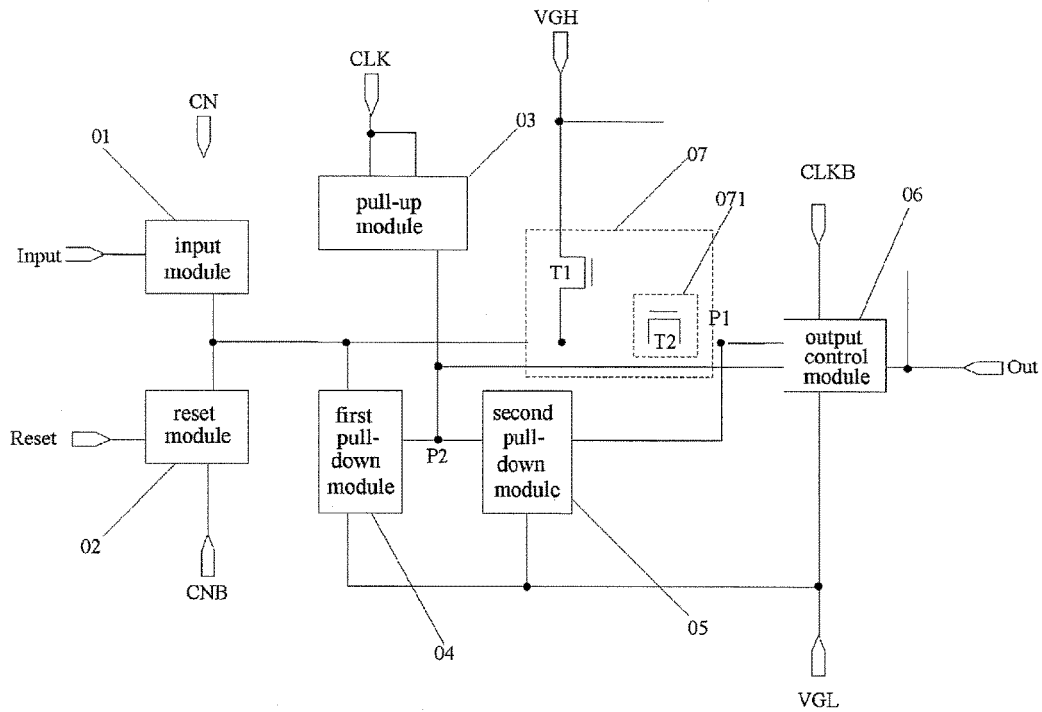
FIG. 5 is an illustrative schematic diagram of the structure of a transmission module in a shift register provided by the embodiments of the present disclosure.

Upon implementation, in the above shift register, as shown in FIG. 5, the output denoising module 07 further comprises a transmission module 071. The transmission module 071 is connected between the high level signal terminal VGH, the output terminal of the input module 01, the output terminal of the reset module 02, the output terminal of the first pull-down module 04, the drain of the first switch transistor T1, and the first node P1. The transmission module 071 is used for filtering and denoising a signal of the drain of the first switch transistor T1 and then outputting it to the first node P1.

Specifically, the transmission module 071 is in normally open state under the control of the high level signal terminal VGH, which as a monotube transmission gate transfers the scanning signal fed back by the first switch transistor T1 to the first node P1 and filters the signal of the drain of the first switch transistor T1 to further reduce noise of the signal. The transmission module 071 also decreases electric potential of the signal simultaneously, and avoids the problem of charging and discharging of the first capacitor resulting from too high electric potential of the first node P1, which further causes the scanning signal output terminal Out to output a noise signal.

Upon implementation, in the above shift register, as shown in FIG. 5, the transmission module 071 comprises a second switch transistor T2. A gate of the second switch transistor T2 is connected to the high level signal terminal VGH, a source is connected to the drain of the first switch transistor T1, and a drain is connected to the first node P1.

Since the gate of the second switch transistor T2 is connected to the high level signal terminal VGH, the second switch transistor T2 is in normally open state, which as a monotube transmission gate filters and denoises the signal of the drain of the first switch transistor T1. The second switch transistor T2 simultaneously further conducts the drain of the first switch transistor T1 with the first node P1, thereby filtering and denoising the scanning signal fed back by the first switch transistor T1 and then transferring to the first node P1.

Figure 6A:
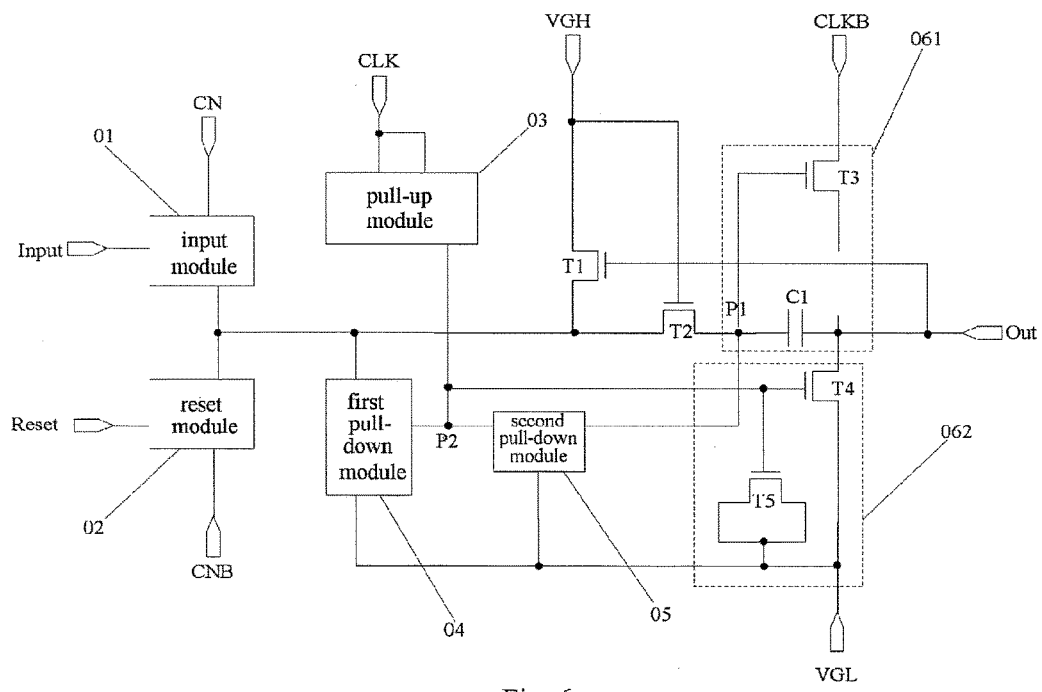
FIGS. 6a and 6b are an illustrative schematic diagram of the structure of an output control module in a shift register provided by the embodiments of the present disclosure, respectively.
Figure 6B:
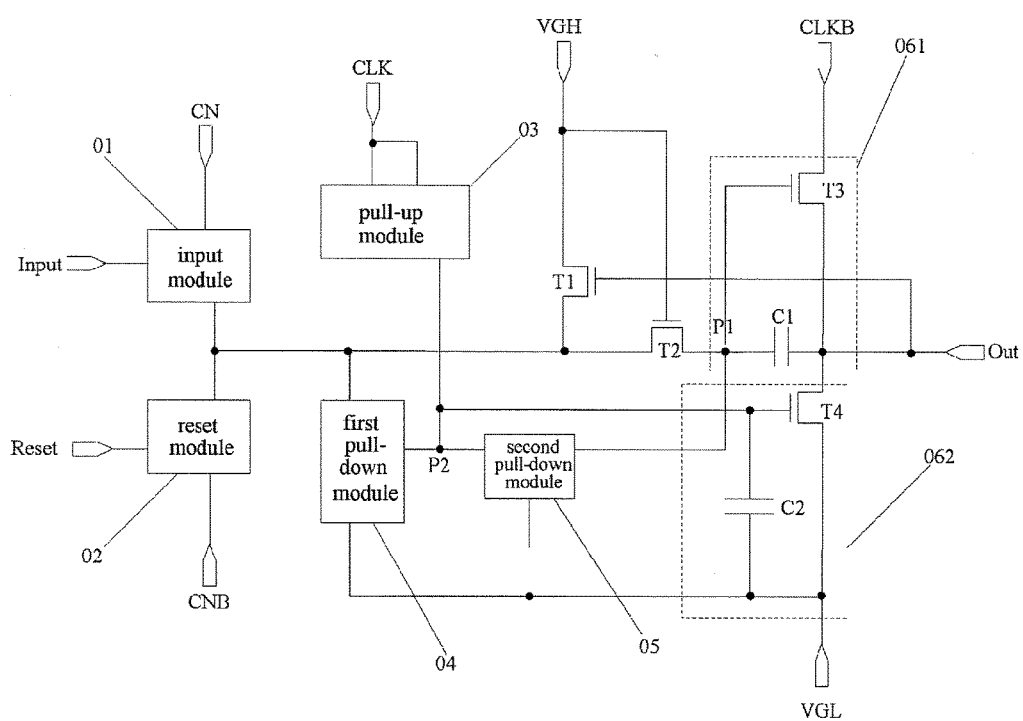

Upon implementation, in the above shift register, as shown in FIGS. 6a and 6b, the output control module 06 comprises a first output control module 061 and a second output control module 062; wherein, the first output control module 061 is connected between the first node P1, the second clock signal terminal CLKB, and the scanning signal output terminal Out. The first output control module 061 is used for controlling the scanning signal output terminal Out to output a signal of the second clock signal terminal CLKB under the control of the first node P1;

the second output control module 062 is connected between the low level signal terminal VGL, the second node P2, and the scanning signal output terminal Out. The second output control module 062 is used for controlling the scanning signal output terminal Out to output a signal of the low level signal terminal VGL under the control of the second node P2.

Specifically, since the first output control module 061 and the second output control module 062 correspondingly output a signal of the second clock signal terminal CLKB and a signal of the low level signal terminal VGL under the control of the first node P1 and the second node P2, respectively, they enable the shift register to output scanning signals to corresponding gate lines during corresponding time periods, thereby driving the display panel to realize progressive scanning.

Upon implementation, in the above shift register, as shown in FIGS. 6a and 6b, the first output control module 061 comprises a third switch transistor T3 and a first capacitor C1; wherein, a gate of the third switch transistor T3 is connected to the first node P1, a source is connected to the second clock signal terminal CLKB, and a drain is connected to the scanning signal output terminal Out; the first capacitor C1 is connected between the first node P1 and the scanning signal output terminal Out.

When the electric potential of the first node P1 is pulled up, the third switch transistor T3 is in conducting state. The conducting third switch transistor T3 conducts the second clock signal terminal CLKB with the scanning signal output terminal Out, and at the same time the first capacitor C1 has bootstrap effect on the electric potential of the first node P1 to further maintain the electric potential of the first node P1.

Upon implementation, in the above shift register, as shown in FIG. 6a, the second output control module 062 comprises a fourth switch transistor T4 and a fifth switch transistor T5; wherein, a gate of the fourth switch transistor T4 is connected to the second node P2, a source is connected to the low level signal terminal VGL, and a drain is connected to the scanning signal output terminal Out; a gate of the fifth switch transistor T5 is connected to the second node P2, and a source and a drain are connected to the low level signal terminal VGL, respectively.

When the electric potential of the second node P2 is pulled up, the fourth switch transistor T4 and the fifth switch transistor T5 are in conducting state. The conducting fourth switch transistor T4 conducts the low level signal terminal VGL with the scanning signal output terminal Out, and at the same time the conducting fifth switch transistor T5 may be equivalent to the capacitor to further maintain the electric potential of the second node P2, thereby reducing noise of the voltage signal of the second node P2.

Upon implementation, in the above shift register, as shown in FIG. 6b, the second output control module 062 comprises a fourth switch transistor T4 and a second capacitor C2; wherein, a gate of the fourth switch transistor T4 is connected to the second node P2, a source is connected to the low level signal terminal VGL, and a drain is connected to the scanning signal output terminal Out; the second capacitor C2 is connected between the second node P2 and the low level signal terminal VGL.

When the electric potential of the second node P2 is pulled up, the fourth switch transistor T4 is in conducting state. The conducting fourth switch transistor T4 conducts the low level signal terminal VGL with the scanning signal output terminal Out, and at the same time the second capacitor C2 can further maintain the electric potential of the second node P2, thereby reducing noise of the voltage signal of the second node P2.

Figure 7A:
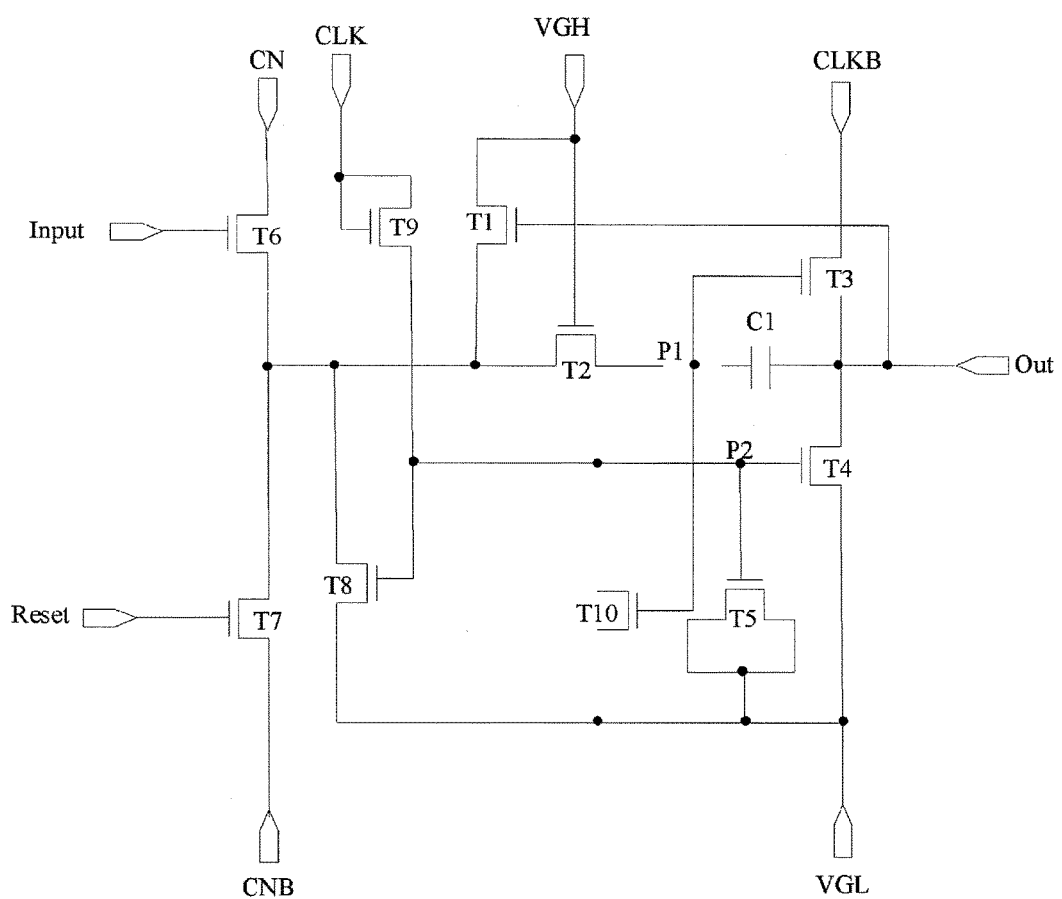
FIGS. 7a and 7b are an illustrative schematic diagram of the structure of a shift register provided by the embodiments of the present disclosure, respectively.
Figure 7B:
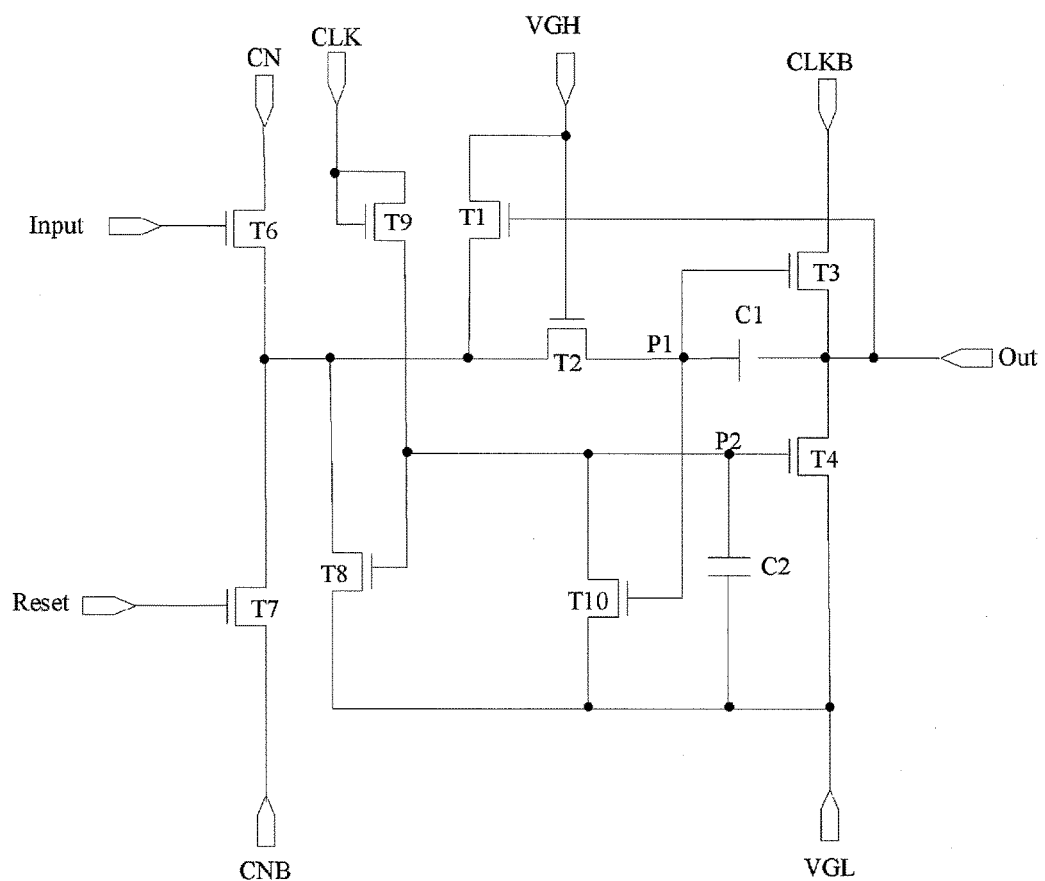

Upon implementation, in the above shift register, as shown in FIGS. 7a and 7b, the input module 01 comprises a sixth switch transistor T6. A gate of the sixth switch transistor T6 is connected to the signal input terminal Input, a source is connected to the first reference signal terminal CN, and a drain is connected to the drain of the first switch transistor T1 and the source of the second switch transistor T2, respectively.

When the signal input terminal Input inputs a signal, the sixth switch transistor T6 is in conducting state. The conducting sixth switch transistor T6 conducts the first reference signal terminal CN with the source of the second switch transistor T2 and transfers the signal of the first reference signal terminal CN to the first node P1 via the second switch transistor T2.

Upon implementation, in the above shift register, as shown in FIGS. 7a and 7b, the reset module 02 comprises a seventh switch transistor T7. A gate of the seventh switch transistor T7 is connected to the reset signal terminal Reset, a source is connected to the second reference signal terminal CNB, and a drain is connected to the drain of the first switch transistor T1 and the source of the second switch transistor T2.

When the reset signal terminal Reset inputs a signal, the seventh switch transistor T7 is in conducting state. The conducting seventh switch transistor T7 conducts the second reference signal terminal CNB with the source of the second switch transistor T2 and transfers the signal of the second reference signal terminal CNB to the first node P1 via the second switch transistor T2.

Upon implementation, in the above shift register, as shown in FIGS. 7a and 7b, the first pull-down module 04 comprises an eighth switch transistor T8. A gate of the eighth switch transistor T8 is connected to the second node P2, a source is connected to the low level signal terminal VGL, and a drain is connected with the drain of the first switch transistor T1 and the source of the second switch transistor T2, respectively.

When the electric potential of the second node P2 is pulled up, the eighth switch transistor T8 is in conducting state. The conducting eighth switch transistor T8 conducts the source of the second switch transistor T2 with the low level signal terminal VGL to thereby pull down the electric potential of the source of the second switch transistor T2.

Upon implementation, in the above shift register, as shown in FIGS. 7a and 7b, the pull-up module 03 comprises a ninth switch transistor T9. A gate and a source of the ninth switch transistor T9 are connected to the first clock signal terminal CLK, respectively, and a drain is connected to the second node P2.

When the first clock signal terminal CLK inputs a high level signal, the ninth switch transistor T9 is in conducting state. The conducting ninth switch transistor T9 conducts the first clock signal terminal CLK with the second node P2 to thereby pull up the electric potential of the second node P2.

Upon implementation, in the above shift register, as shown in FIGS. 7a and 7b, the second pull-down module 05 comprises a tenth switch transistor T10. A gate of the tenth switch transistor T10 is connected to the first node Pb, a source is connected to the low level signal terminal VGL, and a drain is connected to the second node P2.

When the electric potential of the first node Pb is pulled up, the tenth switch transistor T10 is in conducting state. The conducting tenth switch transistor T10 conducts the second node P2 with the low level signal terminal VGL to thereby pull down the electric potential of the second node P2.

It is noted that the switch transistor mentioned in the above embodiments of the present disclosure may be a thin film transistor (TFT) and may also be a metal oxide semiconductor (MOS) field effect transistor, which is not defined here. In the implementation, the source and the drain of these transistors can be exchanged, which are not specifically differentiated. At the time of describing the specific embodiments, the thin film transistor is used as an example for explanation.

In addition, since the signal input terminal Input and the reset signal terminal Reset in the above shift register provided in the embodiments of the present disclosure are symmetrically designed and their functions can be exchanged, the above shift register provided by the embodiments of the present disclosure can realize bidirectional scanning.

Generally, when forward scanning is started, the first reference signal terminal CN provides a high level signal, and the second reference signal terminal CNB provides a low level signal. Generally, upon backward scanning, the first reference signal terminal CN provides a low level signal, and the second reference signal terminal CNB provides a high level signal.

Figure 8:
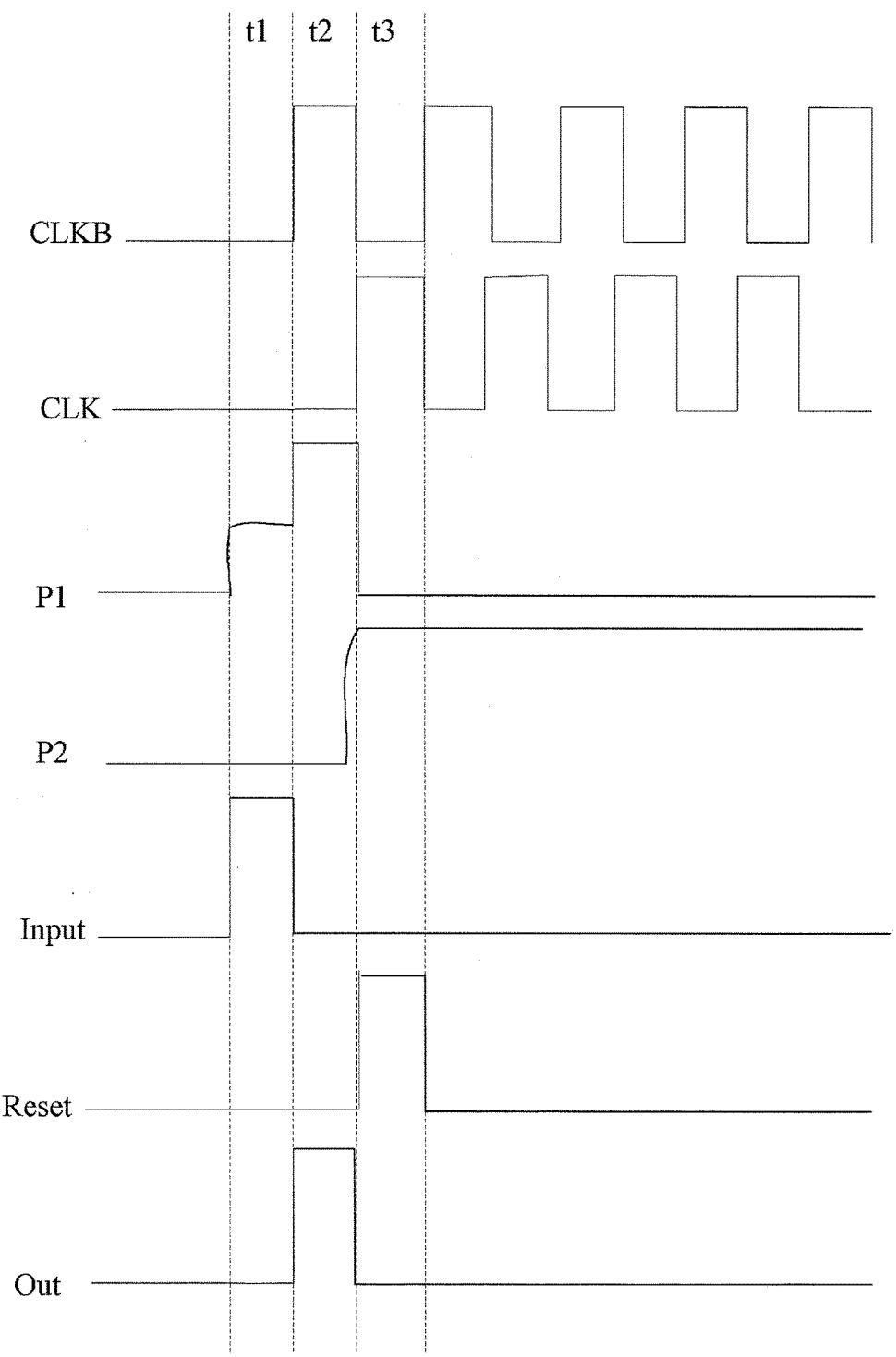
FIG. 8 is an input and output time sequential diagram of a shift register provided by the embodiments of the present disclosure.

Taking the forward scanning as an example, the operation process of the shift register provided by the embodiments of the present disclosure is depicted as follows in combination with the shift register as shown in FIG. 7a and the input and output time sequential diagram of FIG. 7 as shown in FIG. 8. Specifically, three phases t1~t3 in the input and output time sequential diagram as shown in FIG. 8 are selected. In the following depiction, 1 represents a high level signal and 0 represents a low level signal.

In phase t1, Input=1, CLKB=0, CLK=0, Reset=0, CN=1, CNB=0. Due to Input=1, the sixth switch transistor T6 is conducting. The conducting sixth switch transistor T6 conducts the first reference signal terminal CN with the source of the second switch transistor T2 to thereby pull up electric potential of the source of the second switch transistor T2. Since the second switch transistor T2 is in normally open state, the electric potential of the first node P1 is also pulled up and at the same time the first capacitor C1 is charged. Since the electric potential of the first node P1 is pulled up, the third switch transistor T3 and the tenth switch transistor T10 are in conducting state. The conducting third switch transistor T3 conducts the second clock signal terminal CLKB with the scanning signal output terminal Out. At that time CLKB=0, thus the scanning signal output terminal Out outputs a low level signal. The conducting tenth switch transistor T10 conducts the second node P2 with the low level signal terminal VGL to thereby pull down electric potential of the second node P2. The phase t1 is a charging phase.

In phase t2, Input=0, CLKB=1, CLK=0, Reset=0, CN=1, CNB=0. Due to the bootstrap effect of the first capacitor C1, the electric potential of the first node P1 is further elevated. Thus, the third switch transistor T3 is still in conducting state. However, at that time CLKB=1, thus the scanning signal output terminal Out outputs a high level signal. Meanwhile, the tenth switch transistor T10 is still in conducting state, thus the electric potential of the second node P2 continues to be pulled down. The phase t2 is a scanning signal output phase.

In phase t3, Input=0, CLKB=0, CLK=1, Reset=1, CN=1, CNB=0. Due to Reset=1, the seventh switch transistor T7 is conducting. The conducting seventh switch transistor T7 conducts the second reference signal terminal CNB with the source of the second switch transistor T2. Due to CNB=0, the electric potential of the source of the second switch transistor T2 is pulled down. Since the second switch transistor T2 is in normally open state, the electric potential of the first node P1 is also pulled down. Since the electric potential of the first node P1 is pulled down, the third switch transistor T3 and the tenth switch transistor T10 are in cut-off state. Due to CLK=1, the ninth switch transistor T9 is conducting. The conducting ninth switch transistor T9 conducts the first clock signal terminal CLK with the second node P2. Thus, the electric potential of the second node P2 is pulled up. At that time, the fourth switch transistor T4 is in conducting state. The conducting fourth switch transistor T4 conducts the low level signal terminal VGL with the scanning signal output terminal Out, thus the scanning signal output terminal Out outputs a low level signal. The phase t3 is a non scanning signal output phase.

In subsequent time periods, the scanning signal output terminal Out will keep outputting a low level signal until the signal input terminal Input inputs a high level signal again in a certain time period. Then, the shift register will repeat the above operation process.

On the basis of the same inventive concept, a second aspect of the present disclosure provides a gate driving circuit comprising multiple cascaded shift registers as provided by the embodiments of the present disclosure, wherein the scanning signal output terminal of each of the shift registers except the first shift register and the last shift register inputs a trigger signal to the signal input terminal of its next adjacent shift register, and inputs a reset signal to the reset signal terminal of its previous adjacent shift register; the scanning signal output terminal of the first shift register inputs a trigger signal to the signal input terminal of the second shift register; the scanning signal output terminal of the last shift register inputs a reset signal to itself and the reset signal terminal of the previous shift register.

Figure 9:
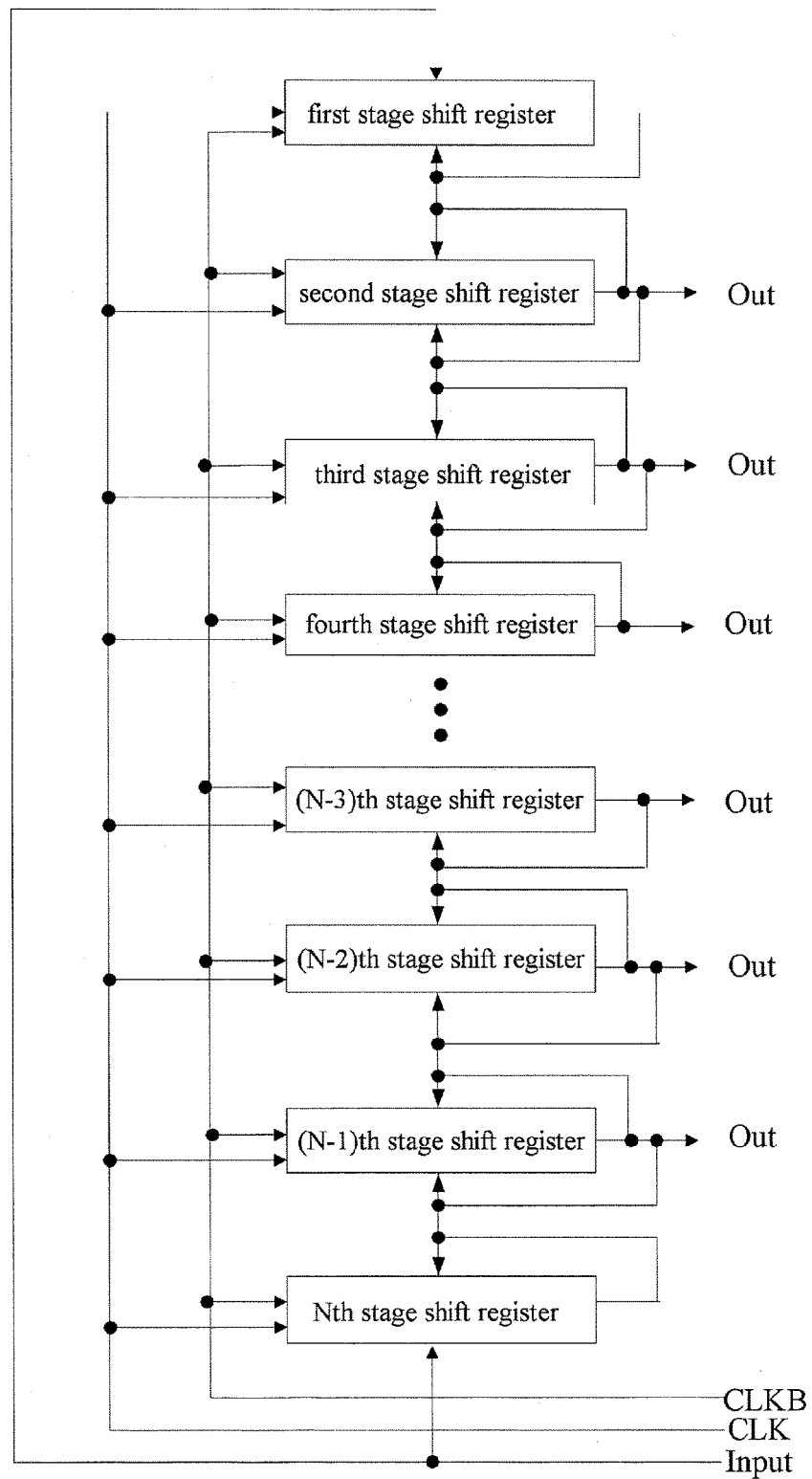
FIG. 9 is a schematic diagram of the structure of a gate driving circuit provided by the embodiments of the present disclosure.

For the convenience of explanation, FIG. 9 shows N shift registers, which are a first stage shift register, a second stage shift register, a third stage shift register, a fourth stage shift register . . . an $(N-3)^{th}$ stage shift register, an $(N-2)^{th}$ stage shift register, an $(N-1)^{th}$ stage shift register, and an $N^{th}$ stage shift register, respectively; wherein, the signal output terminal Out of the $(N-1)^{th}$ stage shift register not only outputs a gate starting signal to its connected gate lines, but also outputs a reset signal to the $(N-2)^{th}$ stage shift register, and at the same time further outputs a trigger signal to the $N^{th}$ stage shift register.

Specifically, each shift register in the above gate driving circuit is identical in function and structure with the aforesaid shift register provided by the present disclosure, repeated details of which are not given here.

On the basis of the same inventive concept, a third aspect of the present disclosure provides a display panel comprising the above gate driving circuit provided by the embodiments of the present disclosure. Since the principle of the display panel is similar to that of the gate driving circuit, the implementation of the display panel may refer to the implementation of the gate driving circuit, repeated details of which are not given here.

On the basis of the same inventive concept, a fourth aspect of the present disclosure provides a display device comprising the above display panel provided by the embodiments of the present disclosure. The display device may be applied in any product or component having display function such as mobile phone, tablet computer, television, display, notebook computer, digital frame, navigator, and so on. Since the principle of the display device is similar to that of the display panel, the implementation of the display device may refer to the implementation of the display panel, repeated details of which are not given here.

The embodiments of the present disclosure provide a shift register, a gate driving circuit, a display panel and a display device, wherein the shift register comprises an input module, a reset module, a pull-up module, a first pull-down module, a second pull-down module, an output control module, and an output denoising module; wherein, the input module is used for pulling up electric potential of the first node under the control of the signal input terminal; the reset module is used for pulling down electric potential of the first node under the control of the reset signal terminal; the pull-up module is used for pulling up electric potential of the second node under the control of the first clock signal terminal; the first pull-down module is used for pulling down electric potential of the first node under the control of the second node; the second pull-down module is used for pulling down electric potential of the second node under the control of the first node; the output control module is used for controlling the scanning signal output terminal to choose to output a signal of the second clock signal terminal or a signal of the low level signal terminal under the control of the first node and the second node. The function of the shift register of outputting a scanning signal is achieved by virtue of such arrangement. Meanwhile, the output denoising module feeds the scanning signal back to the first control terminal of the output control module when the scanning signal output terminal outputs the scanning signal, thereby reducing noise of the signal of the first control terminal of the output control module and further reducing noise of the scanning signal outputted by the scanning signal output terminal. In this way lossless transmission of signal is enhanced, which reduces power consumption and thereby increases the yield of the display panel.

Obviously, those skilled in the art can make modifications and variations to the present disclosure without departing from the spirit and scope thereof. In this way, if these modifications and variations to the present disclosure pertain to the scopes of the claims of the present disclosure and equivalent techniques thereof, the present disclosure also intends to include these modifications and variations.

The invention claimed is:

1. A shift register, comprising: an input module, a reset module, a pull-up module, a first pull-down module, a second pull-down module, an output control module, and an output denoising module, comprising:

an input terminal of said input module connected to a first reference signal terminal, a control terminal of said input module is connected to a signal input terminal, an output terminal of said input module is connected to a first node, wherein said input module is used for pulling up electric potential of said first node under the control of said signal input terminal;

an input terminal of said reset module connected to a second reference signal terminal, a control terminal of said reset module is connected to a reset signal terminal, an output terminal of said reset module is connected to said first node, wherein said reset module is used for pulling down electric potential of said first node under the control of said reset signal terminal;

an input terminal and a control terminal of said pull-up module connected to a first clock signal terminal, respectively, an output terminal of said pull-up module is connected to a second node, wherein said pull-up module is used for pulling up electric potential of said second node under the control of said first clock signal terminal;

an input terminal of said first pull-down module connected to a low level signal terminal, wherein a control terminal of said first pull-down module is connected to said second node, an output terminal of said first pull-down module is connected to said first node, wherein said first pull-down module is used for pulling down electric potential of said first node under the control of said second node;

an input terminal of said second pull-down module connected to a low level signal terminal, a control terminal of said second pull-down module is connected to said first node, an output terminal of said second pull-down module is connected to said second node, wherein said second pull-down module is used for pulling down electric potential of said second node under the control of said first node;

a first input terminal of said output control module connected to said low level signal terminal, a second input terminal of said output control module is connected to a second clock signal terminal, a first control terminal of said output control module is connected to said first node, a second control terminal of said output control module is connected to said second node, an output terminal of said output control module is connected to said scanning signal output terminal, wherein said output control module is used for controlling said scanning signal output terminal to choose to output a signal of said second clock signal terminal or a signal of said low level signal terminal under the control of said first node and said second node;

an input terminal of said output denoising module connected to a high level signal terminal, wherein a control terminal of said output denoising module is connected to said scanning signal output terminal, an output terminal of said output denoising module is connected to said first node, said output denoising module is used for feeding a scanning signal back to the first control terminal of said output control module when said scanning signal output terminal outputs said scanning signal.

2. The shift register according to claim 1, wherein, said output denoising module comprises a first switch transistor,
wherein a gate of said first switch transistor is connected to said scanning signal output terminal, a source of said first switch transistor is connected to said high level signal terminal, a drain of said first switch transistor is connected to said first node.

3. The shift register according to claim 2, wherein, said output denoising module further comprises a transmission module,
wherein said transmission module is connected between said high level signal terminal, the output terminal of said input module, the output terminal of said reset module, the output terminal of said first pull-down module, the drain of said first switch transistor, and said first node, said transmission module is used for filtering and denoising a signal of the drain of said first switch transistor and then outputting it to said first node.

4. The shift register according to claim 3, wherein said transmission module comprises a second switch transistor,
wherein a gate of said second switch transistor is connected to said high level signal terminal, a source of said second switch transistor is connected to the drain of said first switch transistor, and a drain of said second switch transistor is connected to said first node.

5. The shift register according to claim 1, wherein, said output control module comprises a first output control module and a second output control module, wherein
said first output control module is connected between said first node, said second clock signal terminal, and said scanning signal output terminal, said first output control module is used for controlling said scanning signal output terminal to output a signal of said second clock signal terminal under the control of said first node; and
wherein said second output control module is connected between said low level signal terminal, said second node, and said scanning signal output terminal, and wherein said second output control module is used for controlling said scanning signal output terminal to output a signal of said low level signal terminal under the control of said second node.

6. The shift register according to claim 5, wherein, said first output control module comprises a third switch transistor and a first capacitor, wherein a gate of said third switch transistor is connected to said first node, a source of said third switch transistor is connected to said second clock signal terminal, a drain of said third switch transistor is connected to said scanning signal output terminal; and wherein
said first capacitor is connected between said first node and said scanning signal output terminal.

7. The shift register according to claim 5, wherein said second output control module comprises a fourth switch transistor and a fifth switch transistor, wherein
a gate of said fourth switch transistor is connected to said second node, a source of said fourth switch transistor is connected to said low level signal terminal, and a drain of said fourth switch transistor is connected to said scanning signal output terminal;
and wherein a gate of said fifth switch transistor is connected to said second node, and a source of said fifth switch transistor and a drain of said fifth switch transistor are connected to said low level signal terminal, respectively.

8. The shift register according to claim 5, wherein, said second output control module comprises a fourth switch transistor and a second capacitor; wherein a gate of said fourth switch transistor is connected to said second node, a source of said fourth switch transistor is connected to said low level signal terminal, and a drain of said fourth switch transistor is connected to said scanning signal output terminal;
And wherein said second capacitor is connected between said second node and said low level signal terminal.

9. The shift register according to claim 4, wherein said input module comprises a sixth switch transistor,
wherein a gate of said sixth switch transistor is connected to said signal input terminal, a source of said sixth switch transistor is connected to said first reference signal terminal, and a drain of said sixth switch transistor is connected to the drain of said first switch transistor and the source of said second switch transistor, respectively.

10. The shift register according to claim 4, wherein; said reset module comprises a seventh switch transistor,
wherein a gate of said seventh switch transistor is connected to said reset signal terminal, a source of said seventh switch transistor is connected to said second reference signal terminal, and a drain of said seventh switch transistor is connected to the drain of said first switch transistor and the source of said second switch transistor.

11. The shift register according to claim 4, wherein, said first pull-down module comprises an eighth switch transistor,
wherein a gate of said eighth switch transistor is connected to said second node, a source of said eighth switch transistor is connected to said low level signal terminal, and a drain of said eighth switch transistor is connected with the drain of said first switch transistor and the source of said second switch transistor, respectively.

12. The shift register according to claim 1 wherein, said pull-up module comprises a ninth switch transistor,
wherein a gate and a source of said ninth switch transistor are connected to said first clock signal terminal, respectively, and a drain of said ninth switch transistor is connected to said second node.

13. The shift register according to claim 1, wherein said second pull-down module comprises a tenth switch transistor,
wherein a gate of said tenth switch transistor is connected to said first node, a source of said tenth switch transistor is connected to said low level signal terminal, and a drain of said tenth switch transistor is connected to said second node.

14. A gate driving circuit, comprising multiple cascaded shift registers according to claim 1, wherein the scanning signal output terminal of each of the shift registers except the first shift register and the last shift register inputs a trigger signal to the signal input terminal of its next adjacent shift register, and inputs a reset signal to the reset signal terminal of its previous adjacent shift register; and wherein the scanning signal output terminal of the first shift register inputs a trigger signal to the signal input terminal of the second shift register; the scanning signal output terminal of the last shift register inputs a reset signal to itself and the reset signal terminal of the previous shift register.

15. The gate driving circuit according to claim 14, wherein said output denoising module comprises a first switch transistor,
wherein a gate of said first switch transistor is connected to said scanning signal output terminal, a source of said first switch transistor is connected to said high level signal terminal, and a drain of said first switch transistor is connected to said first node.

16. The gate driving circuit according to claim 15, wherein said output denoising module further comprises a transmission module,
wherein said transmission module is connected between said high level signal terminal, the output terminal of said input module, the output terminal of said reset module, the output terminal of said first pull-down module, the drain of said first switch transistor, and said first node, said transmission module is used for filtering and denoising a signal of the drain of said first switch transistor and then outputting it to said first node.

17. The gate driving circuit according to claim 16, wherein said transmission module comprises a second switch transistor,
wherein a gate of said second switch transistor is connected to said high level signal terminal, a source of said second switch transistor is connected to the drain of said first switch transistor, and a drain of said second switch transistor is connected to said first node.

18. The gate driving circuit according to claim 14, wherein, said output control module comprises a first output control module and a second output control module; wherein
said first output control module is connected between said first node, said second clock signal terminal, and said scanning signal output terminal, and said first output control module is used for controlling said scanning signal output terminal to output a signal of said second clock signal terminal under the control of said first node;
wherein said second output control module is connected between said low level signal terminal, said second node, and said scanning signal output terminal, said second output control module is used for controlling said scanning signal output terminal to output a signal of said low level signal terminal under the control of said second node.

19. A display panel, comprising a gate driving circuit according to claim 14.

* * * * *